United States Patent
Hoffmann et al.

(10) Patent No.: US 9,150,457 B2
(45) Date of Patent: Oct. 6, 2015

(54) PIEZO-ELECTRIC CERAMIC COMPOSITION, METHOD FOR PRODUCING THE COMPOSITION, AND ELECTRIC COMPONENT COMPRISING THE COMPOSITION

(75) Inventors: Christian Hoffmann, Deutschlandsberg (AT); Alain Brice Kounga Njiwa, Dietikon (CH); Yongli Wang, Deutschlandsberg (AT)

(73) Assignee: EPCOS AG, Munich (DE)

( * ) Notice: Subject to any disclaimer, the term of this patent is extended or adjusted under 35 U.S.C. 154(b) by 765 days.

(21) Appl. No.: 13/388,284

(22) PCT Filed: Jul. 29, 2010

(86) PCT No.: PCT/EP2010/061053
§ 371 (c)(1),
(2), (4) Date: Apr. 13, 2012

(87) PCT Pub. No.: WO2011/012682
PCT Pub. Date: Feb. 3, 2011

(65) Prior Publication Data
US 2012/0187325 A1 Jul. 26, 2012

(30) Foreign Application Priority Data
Jul. 31, 2009 (DE) .......................... 10 2009 035 425

(51) Int. Cl.
*C04B 35/468* (2006.01)
*C04B 35/475* (2006.01)
*H01L 41/187* (2006.01)

(52) U.S. Cl.
CPC ......... *C04B 35/4682* (2013.01); *C04B 35/4686* (2013.01); *C04B 35/475* (2013.01); *H01L 41/187* (2013.01); *H01L 41/1878* (2013.01); *C04B 2235/3201* (2013.01); *C04B 2235/3206* (2013.01); *C04B 2235/3244* (2013.01); *C04B 2235/3262* (2013.01); *C04B 2235/3281* (2013.01); *C04B 2235/3284* (2013.01); *C04B 2235/768* (2013.01)

(58) Field of Classification Search
USPC .............. 252/62.9 R, 62.9 PZ; 501/134, 135; 310/311
See application file for complete search history.

(56) References Cited

U.S. PATENT DOCUMENTS

| | | | |
|---|---|---|---|
| 7,985,348 B2 | 7/2011 | Tsukada et al. | |
| 8,734,670 B2 * | 5/2014 | Jeon et al. | 252/62.9 PZ |
| 2008/0237531 A1 | 10/2008 | Tsukada et al. | |
| 2013/0161556 A1 * | 6/2013 | Jeon et al. | 252/62.9 PZ |

FOREIGN PATENT DOCUMENTS

| | | |
|---|---|---|
| CN | 101 531 510 | 9/2009 |
| DE | 102008014728 | 10/2008 |
| JP | 2005-047745 | 2/2005 |
| JP | 2005 047746 | 2/2005 |
| JP | 2005-47748 | * 2/2005 |
| JP | 2005 047748 | 2/2005 |
| JP | 2008-098627 | 4/2008 |
| JP | 2009-007181 | 1/2009 |
| JP | 2009-007182 | 1/2009 |
| WO | WO 2009/116683 | 9/2009 |

OTHER PUBLICATIONS

Translation for JP 2005-47748, Feb. 24, 2005.*
Wang et al, "Dielectric and Piezoelectric Properties of Lead-Free BaTiO3-Bi(Zn0.5Ti0.5)O3 and (Bi0.5Na0.5)TiO3-Bi(Zn0.5Ti0.5)O3 Ceramics", Ferroelectrics, 380, Jan. 2009, pp. 177-182.*
Huang et al, "Structure and Ferroelectric Properties of Bi(Zn1/2Ti1/2)o3-(bi1/2K1/2)TiO3 Perovskite Solid Solutions", EEE Trans. Ultrasonics, Ferroelectrics, and Freq. Control, vol. 56, No. 7, Jul. 1, 2009, pp. 1304-1308.*
"Ferroelectrics", Kap. 2.4.1 Barium Titanate, *Ullmann's Encyclopedia of Industrial Chemistry*, Online, 2005 Wiley-VCH Verlag GmbH & Co.
Muanghlua, et al., "Preparation and properties of lead free bismuth sodium titanate-bismuth zince titanate ceramics", *INSPEC* online Accesion No. 10715251, 2009 The Institute of Engineering and Technology.
Zhang et al., "Giant strain in lead-free piezoceramics $Bi_{0.5}Na_{0.5}TiO_3$-$BaTiO_3$-$K_{0.5}Na_{0.5}NbO_3$ system", *Applied Physics Letters* 91, 2007.
Takenaka et al., "Current developments and prospective of lead-free piezoelectric ceramics", *Japanese Journal of Applied Physics*, vol. 47, No. 5, pp. 3787-3801, 2008.
Saito et al., "Lead-Free Piezoceramics", *Nature*, Nov. 4, 2004; 432(7013): 24-5.
H. Chien-Chih et al., "Phase transitions and dielectric properties in Bi(Zn1/2Ti1/2) 03- BaTi03 perovskite solid solutions", Journal of Applied Physics, vol. 104, No. 2, pp. 24117-1 to 24117-4, Jul. 30, 2008.
H. Chien-Chih et al., "Phase transitions and dielectric properties in Bi(Zn1/2Ti1/2) 03-Ab03 perovskite solid solutions", Applications of Ferroelectrics, 2008, ISAF 2008, 17th IEEE International Symposium on the, pp. 1-3, Feb. 23, 2008.

(Continued)

*Primary Examiner* — Carol M Koslow
(74) *Attorney, Agent, or Firm* — Cozen O'Connor

(57) ABSTRACT

A piezoelectric ceramic composition comprising: a matrix material comprising at least two matrix components having a perovskite structure or consisting of said matrix components; a first matrix component being selected from $(Bi_{0.5}A_{0.5})EO_3$ and $BaEO_3$; and a further matrix component being $Bi(Me_{0.5}E_{0.5})O_3$, wherein A is selected from an alkali metal, particularly sodium or potassium, or a mixture of alkali metals; wherein E is independently selected from titanium, zirconium and mixtures of titanium and zirconium; and wherein Me is selected from bivalent metals.

21 Claims, 13 Drawing Sheets

(56) References Cited

OTHER PUBLICATIONS

Figure 1:
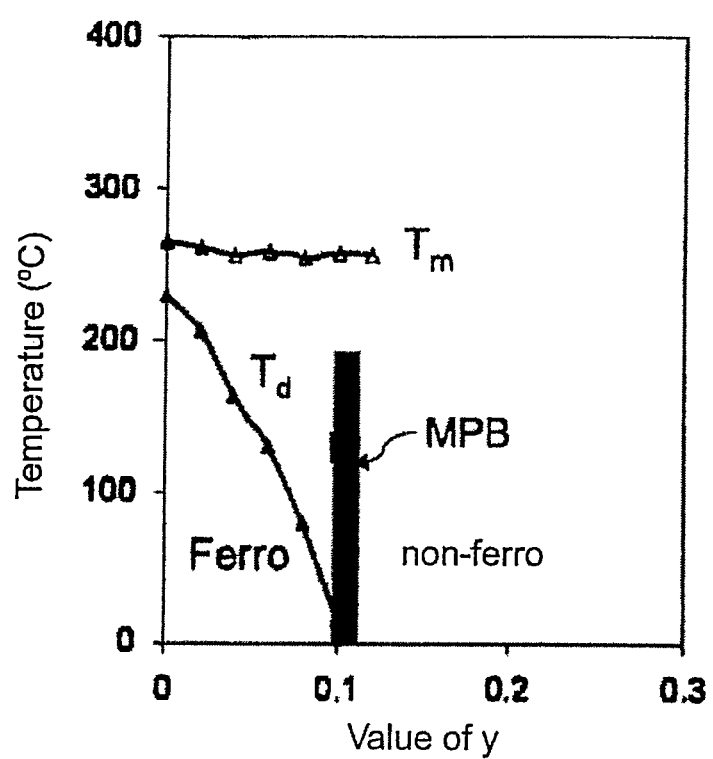

H. Chien-Chih et al., "Structure and ferroelectric properties of Bi (Zn 1/2 Ti 1/2) 03—(Bi 1/2 K1/2) Ti03 perovskite solid solutions", IEEE Transactions on Ultrasonics, Ferroelectrics and Frequency Control, vol. 56, Nr. 7, pp. 1304-1308, Jul. 1, 2009.

L. Wang et al., "Dielectric and Piezoelectric Properties of lead-free BaTi03-Bi (Zn0.5Ti0.5)03 and (Bi0.5Na0.5) Ti03-Bi (Zn0.5Ti0.5)03 Ceramics", Ferroelectrics, vol. 380, Jan. 1, 2009, pp. 177-182.

J. Roedel et al., "Perspective on the development of lead-free Piezoceramics", J. Am. Ceramic Soc., vol. 92, No. 6, pp. 1153-1177, IV. General Considerations: (1) Cost and Toxicity and (4) Phase Diagrams; tablets I & II; VI Bismuth sodium titanate and related materials.

\* cited by examiner

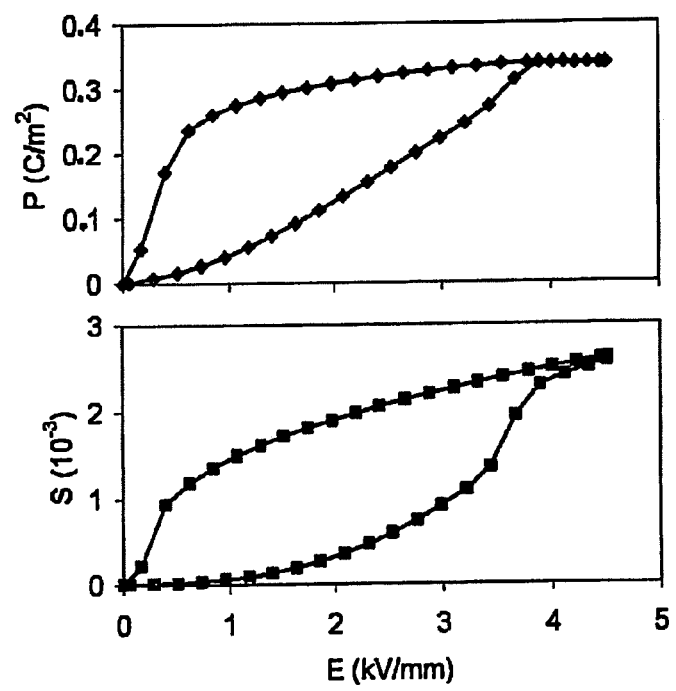

US 9,150,457 B2

PIEZO-ELECTRIC CERAMIC COMPOSITION, METHOD FOR PRODUCING THE COMPOSITION, AND ELECTRIC COMPONENT COMPRISING THE COMPOSITION

RELATED APPLICATIONS

This is a U.S. national stage of application No. PCT/EP2010/061053, filed on Jul. 29, 2010.

This patent application claims the priority of German Patent Application 10 2009 035 425.5 filed Jul. 31, 2009, the disclosure content of which is hereby incorporated by reference.

BACKGROUND OF THE INVENTION

Restriction of the use of certain hazardous substances (RoHS) in electrical and electronic equipment was seriously considered in a number of European Union (EU) legislations and directives (e.g. Marketing of Products Package, RoHs, EuP, etc.) so as to contribute to the protection of human health and environmentally sound recovery and disposal of waste electrical and electronic equipment (WEEE). The last proposal on RoHS (December 2008) sets a stricter ban of hazardous substances for a wider scale of applications. Particularly in medical devices and monitoring and control instruments, the use of lead in electronic ceramic parts (by more than 0.1 weight %) is not an exemption any more after 1 Jan. 2014. However, up to date most of the high Performance piezoelectric devices (sensors, actuators, resonators and so on) have a lead-containing ceramic part. Typically the piezoelectric composition bases on the solid solution of lead zirconate titanate (PZT) and is in the vicinity of the morphortropic phase boundary (MPB) between lead titanate ($PbTiO_3$) and lead zirconate ($PbZrO_3$). The toxic element, lead (Pb), has a content of more than 60 weight % in these materials and thus leads to serious environmental problems both in producing and in post-treating of related WEEEs.

Numerous investigations have been done all over the world particularly in the last 10 years in order to find environmentally friendly substitutions for PZT. Unfortunately a real lead-free material which can completely replace PZT, both in terms of technical performance and in terms of production cost, has not been developed yet. Optimized compositions/structures/techniques have brought about some comparable piezoelectric properties corresponding to specific applications where large electro-strain is not a crucial issue. However, reported materials targeting actuation applications usually have a lower electrostrain response in comparison to that of soft PZT.

With the progress of materials science and engineering, piezoelectric properties of environmentally friendly piezoelectric ceramic materials have been greatly enhanced in the last two decades by optimizing composition, microstructure and processing related parameters. Three important perovskite families, namely barium titanate ($BaTiO_3$-BT), potassium sodium niobate ($K_{0.5}Na_{0.5}NbO_3$-KNN), and bismuth sodium titanate ($Bi_{0.5}Na_{0.5}TiO_3$-BNT) have been intensively studied.

Barium titanate is one of the best known ferroelectrics, and achievements in improving its piezoelectric performance have been attained mostly by tuning the ferroelectric/ferroelastic domain configurations:
a) by fabricating specially oriented ceramics or single crystals, the anisotropic effect of the intrinsic piezoelectric properties can be used (maximum $d_{33}$ of 203 pC/N);
b) by special poling treatment on single crystals, or using advanced sintering technology, the non-180° domains can be refined down to sub-micron scale, and the extrinsic contribution of their boundaries to piezoeffect be strongly enhanced (maximum $d_{33}$ of 500 pC/N);
c) using random field defects (e.g. acceptor substitution and oxygen vacancy couples), the crystal or ceramic can be completely poled and re-depoled by applying and removing electric field. Ultrahigh electro-strain is thus caused by completely reversible domain switching. However, limited by the relative low Curie temperature, $T_C$ (~130° C.), use of this material family is nearly excluded from high performance actuators.

Potassium sodium niobate ($K_{0.5}Na_{0.5}NbO_3$) is a composition close to the MPB between potassium niobate and sodium niobate and has a high $T_C$ of more than 400° C., but its application has been strongly limited by the poor sinterability for a long time. Recently it was found that by introducing Li on A-site and Ta and/or Sb on B-site of the KNN lattice, the polymorphic phase boundary between tetragonal and orthorhombic phases can be shifted to the vicinity of room temperature, and with proper sintering aids the sinterability is greatly improved and piezoelectric properties greatly increased (maximum $S_{33}/E_{33}$ of 300 and 750 pm/V for random or oriented ceramics, respectively—Y. Saito et al. "Lead-Free Piezoceramics," Nature, 432 [4] 84-7 (2004)). Even with optimized compositions and processing conditions, the improved piezoelectric properties of KNN-based ceramics is much lower than typical soft PZT, and their stability against temperature cycling degrades due to the orthorhombic/tetragonal phase transition. At the same time, textured ceramic processing routine has been developed to take advantage of the lattice anisotropicity. The textured ceramics have much better piezoelectric performance (which is comparable to soft PZT) but the complicated processing procedures and the increased cost practically prevent them from use in actuators.

Investigations on bismuth sodium titanate ($Bi_{0.5}Na_{0.5}TiO_3$) ceramics have been focused on finding MPB compostions with other perovskites like $BaTiO_3$, $Bi_{0.5}K_{0.5}TiO_3$, $K_{0.5}Na_{0.5}NbO_3$, and so on. Enhanced piezoelectric properties have been achieved (maximum $d_{33}$ of 328 pC/N) but the best electrostrain response is still far below that of soft PZT. In addition, BNT-based materials usually have a low depoling temperature, $T_d$, above which the polarization and/or piezoelectricity disappear due to the ferroelectric/antiferroelectric phase transition. Typically $T_d$ ranges from 100 to 250° C. and strongly limits the use of ferroelectric BNT-based ceramics in modern actuators. Texturing processes have also been studied but the improvement is not appreciable even disregarding the increased cost (maximum $S_{33}/E_{33}$ of 370 pm/V).

Recently it was reported that $T_d$ can be shifted down to below room temperature in properly modified ENT materials (S. T. Zhang et al. "Giant strain in lead-free piezoceramics $Bi_{0.5}Na_{0.5}TiO_3$—$BaTiO_3$—$K_{0.5}Na_{0.5}NbO_3$ (BNT-BT-KNN) -system", Applied Physics Letters 91, 112906 (2007)). In these compositions ultrahigh strain can be achieved due to the electric field induced ferroelectric phase transition. The effective piezoelectric constant ($S_{max}/E_{max}$) can be comparable (in ceramics maximum $S_{33}/E_{33}$ of 690 pm/V) or even superior to (in single crystals maximum $S_{33}/E_{33}$ more than 2000 pm/V) some of the soft PZT ceramics. Furthermore, the depoling temperature is not a practical limit any more as herein the piezoelectricity is not a necessity for the large strain behavior.

SUMMARY OF THE INVENTION

It is therefore an object of the present invention to provide lead-free ceramic compositions which show high electro-strain response.

An aspect of the invention relates to a variety of lead-free ceramic materials that can provide large electrostrain which is desired for actuation applications. Particularly, a set of lead-free compositions of large strain response when exposed to adequate external electric field is presented. The large electrostrain generally arises basically from a phase transition induced by electric field, and the magnitude of the effective piezoelectric constant Smax/Emax is comparable to some soft PZT being used in commercial piezoelectric actuators.

Generally the lead-free composition contains a matrix material of more than 97 weight %, and as the case may be a small amount of additive of less than 3 weight %.

The matrix material is a solid solution of two or three perovskite components. The first component is $(Bi_{0.5}A_{0.5})TiO_3$ where A is preferably K or Na or a mixture of K and Na, and its content ranges particularly from 0 to 96 mol %. The second component is $BaTiO_3$ and its content ranges particularly from 0 to 96 mol %. The third component can be formulated as $Bi(Me_{0.5}Ti_{0.5})O_3$, where Me represents a divalent metal element, for example Mg, Zn, or a combination of them, and its content ranges from 4 to 15 mol % in particular from 6 to 15 mol %. According to specific embodiments also all or some of the components may comprise Zr instead of Ti.

The small amount of additive contains non-perovskite oxides, for example MnO, CuO, ZnO or a combination of them. These additives are not limited in the form of simple oxides. These oxides may have different oxidizing valences and may be obtained from the corresponding carbonates, nitrates, hydroxides and so on.

The proportions of the three matrix components are adjusted so as to form a morphortropic phase boundary (MPB) between a ferroelectric phase and a pseudo-cubic non-ferroelectric phase [see FIG. 1(a)]. Pseudo-cubic compositions in the vicinity of the phase boundary undergo a structural transition into the ferroelectric phase under a certain electric field, and an opposite transition back to pseudo-cubic phase when the electric field is withdrawn [see FIG. 1(b)]. The accompanied deformation brings about large electrostrain which is comparable to or even higher than that of typical soft PZT ceramics used in advanced actuators. The maximum $S_{max}/E_{max}$ above 800 pm/V can be attained by optimizing the composition, the processing conditions and using proper driving signal.

An additive is particularly added if a lowering of the sintering temperature or a densification is desired. The content of the additive is preferably adjusted so as to lower the sintering temperature and promote the densification without appreciably influencing the electromechanical properties of the matrix composition. High quality high electrostrain lead-free ceramics can be achieved with sintering temperature as low as 1000° C.

According to an embodiment, the main composition can be formulated as $k (Bi_{0.5}A_{0.5})EO_3$-$l BaEO_3$-$m Bi(Me_{0.5}E_{0.5})O_3$, where A for example represents one or two of Na and K, Me for example represents one or two of Mg and Zn, E represents Ti or Zr, $0 \le k \le 0.96$, $0 \le l \le 0.96$ and $k+l+m=1$. Metal oxide additives (3 weight %), for example MnO, ZnO, CuO, or the corresponding carbonates, nitrates, hydrates, or a combination of them, may be included to modify the sintering behavior.

The large electro-strain is usually achieved when before mentioned ceramics are exposed to a certain electric field of not less than $E_{th1}$. Herein $E_{th1}$ is the threshold field strength at which a structural phase transition takes place which leads to large strain.

In comparison with PZT and other piezoelectric ceramics, the materials concerned in this invention need usually no poling procedure before they can be used. This feature leads to simplified process and consequently lower producing cost and less fabricating-related defects for related actuator devices.

Furthermore, currently concerned materials have no polarity restriction in use. They can be driven with unipolar or bipolar voltage, or arbitrary combination of them. The driving conditions are thus more flexible. Furthermore, remanent polarization is not a necessity for the materials presented in this invention in order to get large strain. The high strain performance is guaranteed over a wide temperature interval and is not limited by any critical temperatures like Curie temperature or depoling temperature. In comparison with other high strain lead-free materials, compositions concerned in this invention as a rule need neither textured structure nor special sintering technique. All of them can be readily prepared using conventional solid-state reaction method under ambient pressure at moderate temperature, particularly at 1000-1200° C. The producing cost is thus considerably lowered.

BRIEF DESCRIPTION OF THE INVENTION

Further features, advantages and expediencies become apparent from the following description of the examples and exemplary embodiments.

FIGS. 1(a) and 1(b) show the MPB between a ferroelectric phase and a non-ferroelectric phase, and the high electrostrain due to field induced phase transition for a non-ferroelectric composition in the vicinity of MPB. FIG. 1(a) shows a typical phase diagram of (1-y)[(1-x)BNT-xBT]-yBMT system, herein x is fixed as 0.20 and y is changed from 0 to 0.14. FIG. 1(b) is a typical electromechanical feature of this invention where x=0.20 and y=0.11.

Figure 2:
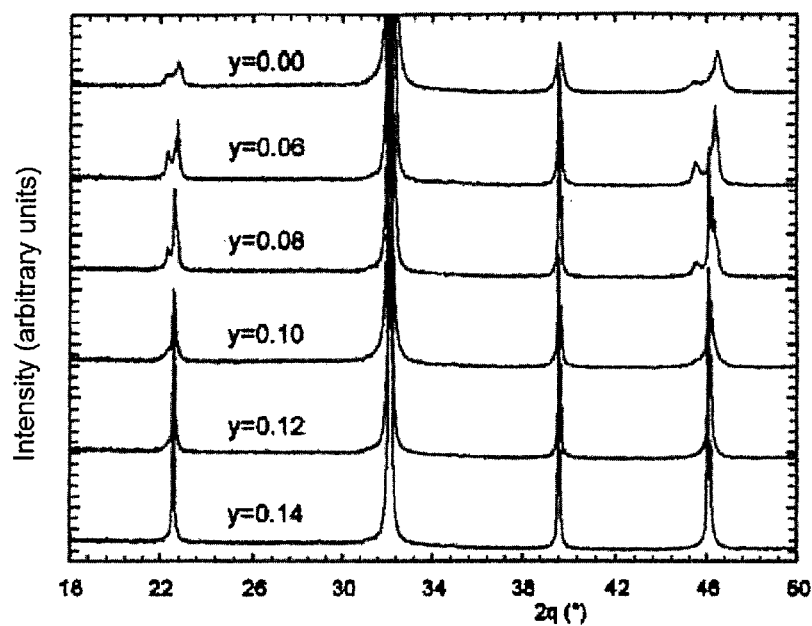
Figure 2:
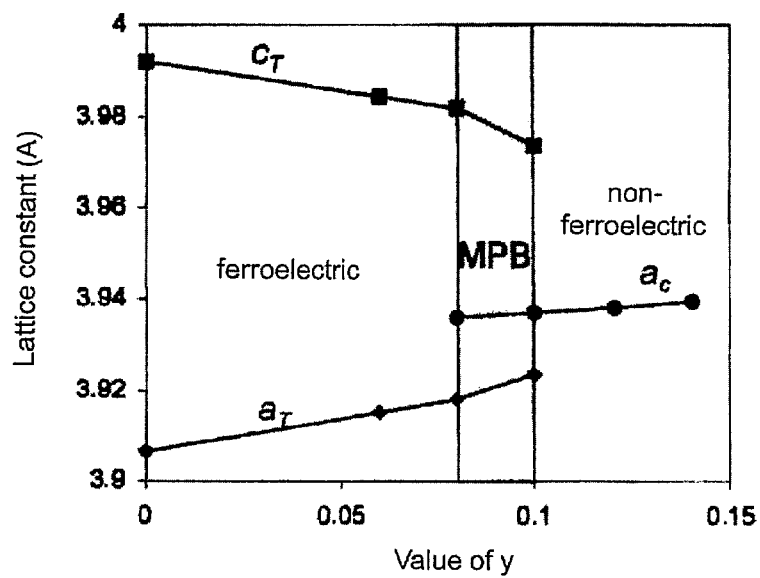

FIGS. 2(a) and 2(b) show XRD patterns of compositions in (1-y)[0.80BNT-0.20BT]-yBMT system, and corresponding lattice constants on crossing the MPB.

Figure 3:
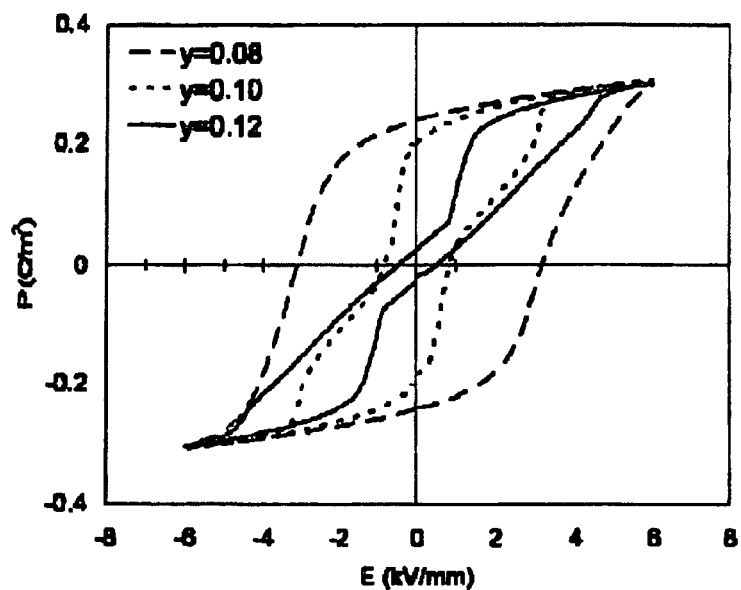
Figure 3:
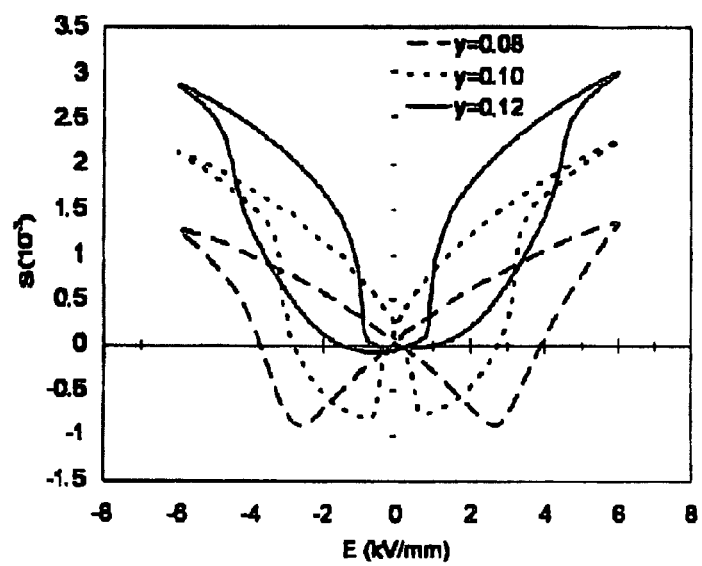

FIGS. 3(a) and 3(b) show P-E and S-E curves of the (1-y) [0.80BNT-0.20BT]-yBMT compositions in the vicinity of MPB.

Figure 4:
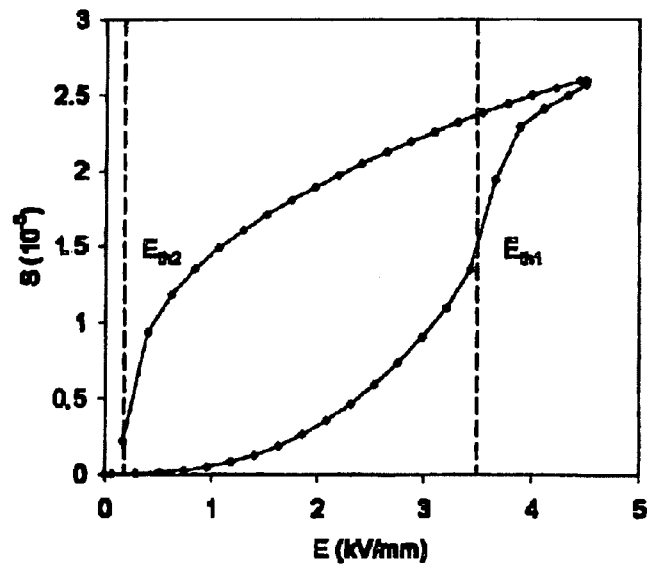
Figure 4:
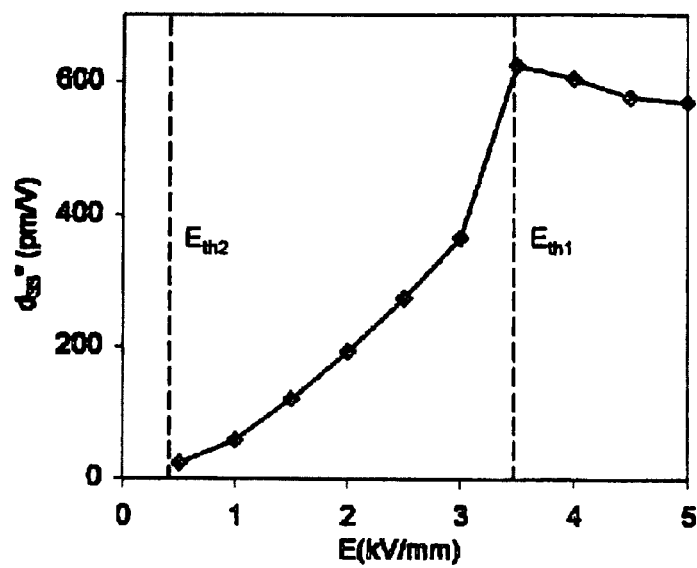

FIGS. 4(a) and 4(b) show electrostrain response of 0.89 [0.80BNT-0.20BT]-0.11BMT where the two characteristic threshold fields $E_{th1}$ and $E_{th2}$, are marked, and electric field dependence of the effective piezoelectric constant, $d_{33}$*.

Figure 5:
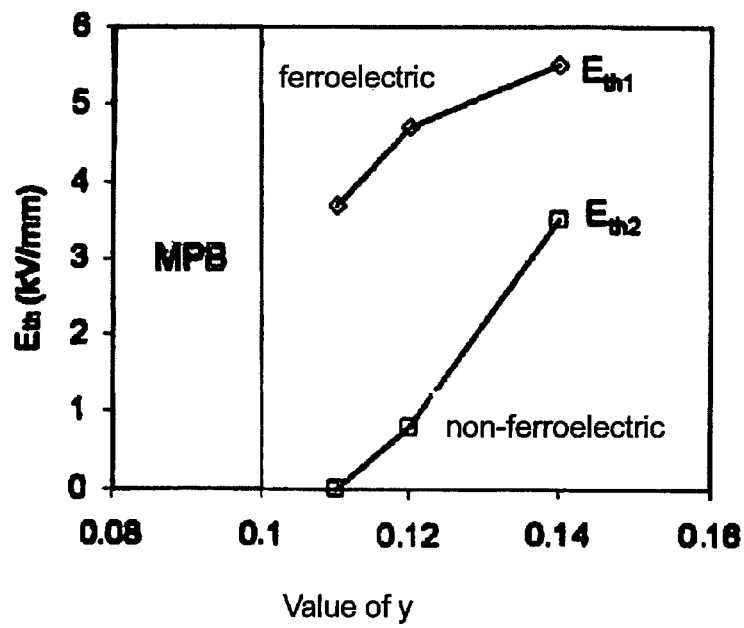
Figure 5:
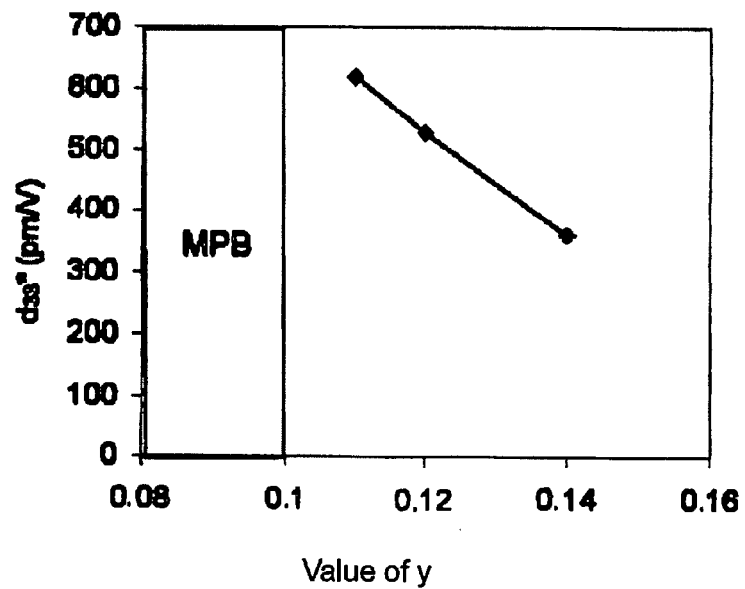

FIGS. 5(a) and 5(b) show variation of threshold fields $E_{th1}$ and $E_{th2}$, and effective piezoelectric constant, $d_{33}$* as a function of BMT content in (1-y)[0.80BNT-0.20BT]-yBMT system.

Figure 6A:
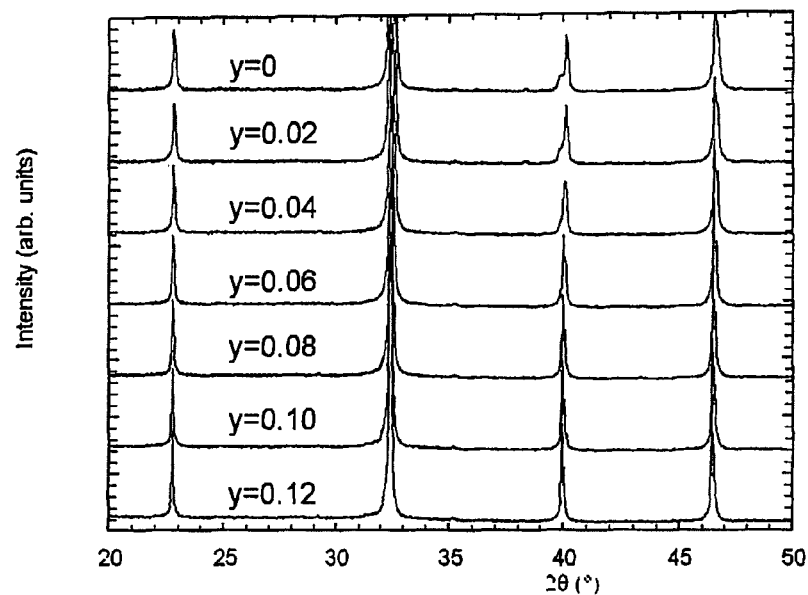
Figure 6B:
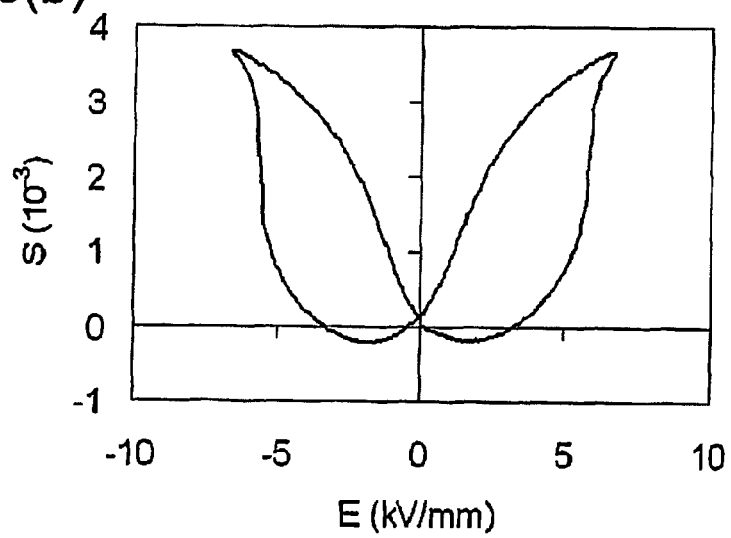

FIGS. 6(a) and 6(b) show XRD patterns of compositions in (1-y)[0.95BNT-0.05BT]-yBMT system, and the electrostrain response of the pseudo-cubic composition in the vicinity of MPB.

FIGS. 7(a) and 7(b) show XRD patterns of compositions in (1-y)[0.93BNT-0.07BT]-yBMT system, and the electrostrain response of the pseudo-cubic composition in the vicinity of MPB.

FIGS. 8(a) and 8(b) show XRD patterns of compositions in (1-y)[0.80BKT-0.20BT]-yBMT system, and the electrostrain response of the pseudo-cubic composition in the vicinity of MPB.

Figure 9A:
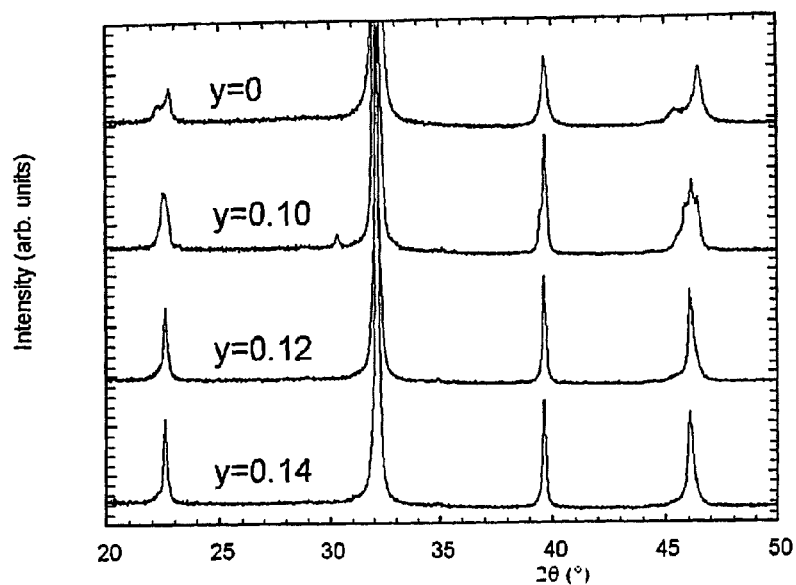
Figure 9B:
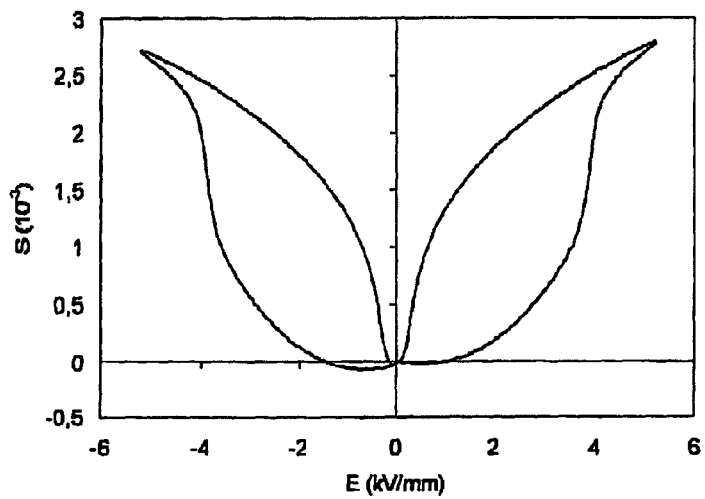

FIGS. 9(a) and 9(b) show XRD patterns of compositions in (1-y) [0.80BNT-0.20 BT]-yBZT system and the electrostrain response of the pseudo-cubic composition in the vicinity of MPB.

Figure 10:
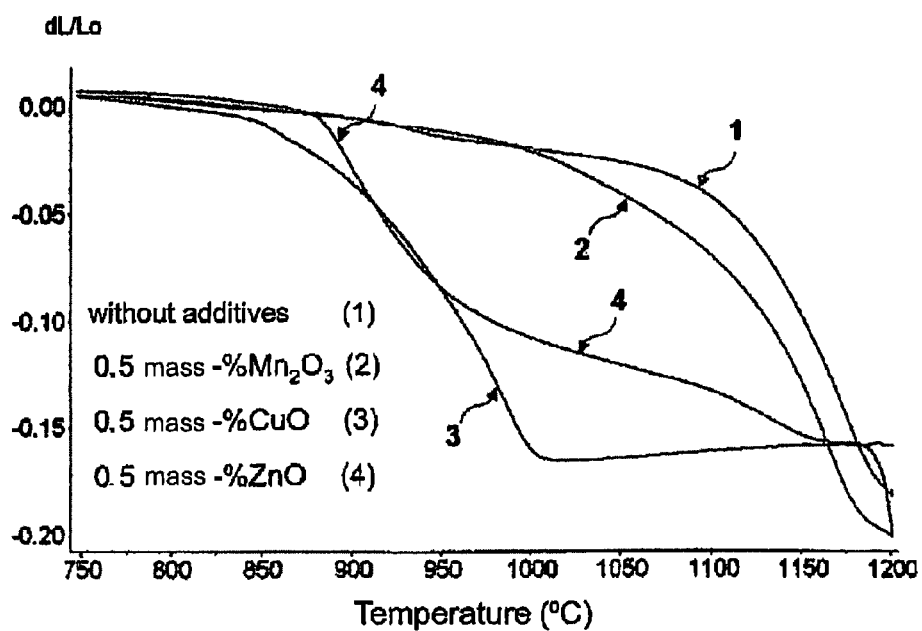

FIG. 10. shows the densification curve of the undoped and oxides-doped BNT-BT-BMT ceramics.

FIGS. 11(a) to 11(c) show the electrostrain response of CuO, ZnO, and Mn2O3 doped BNT-13T-BMT ceramics.

DETAILED DESCRIPTION OF THE DRAWINGS

Example 1

In this example a set of MPBs are formed between a tetragonal ferroelectric phase and a pseudo-cubic non-ferroelectric phase within the ternary System constituted by $(Bi_{0.5}Na_{0.5})TiO_3$, $BaTiO_3$ and $Bi(Mg_{0.5}Ti_{0.5})O_3$, namely (BNT-BT-BMT).

The typical composition can be formulated as (1-y)[(1-x)BNT-xBT]-yBMT, where $0.07<x<1$ and $0.04<y<0.14$. The A/B ratios (with regard to the perovskite $ABO_3$ formula) in this example are all controlled as unit and no additive is introduced. The tetragonal ferroelectric phase is formed by the solid Solution between BNT and BT, and its tetragonality is gradually diminished with increasing BMT content and finally eliminated at the MPB.

Commercially available high purity (>99.8%) powders, $Bi_2O_3$, $Na_2CO_3$, $BaCO_3$, $TiO_2$ and MgO are used as starting materials. A conventional solid state reaction routine is used to prepare the concerned ceramics. The raw particles are weighed according to the stoichiometry of the perovskite $ABO_3$ formula, and then mixed and ground with a ball-mill using Yttrium-stabilized $ZrO_2$ balls as the grinding medium and dehydrated ethanol as the milling agent. The milled slurry is then dried in oven at 60° C. The dried powder is sieved and calcined at temperatures from 750° C. to 900° C. for 2-4 h for the formation of homogeneous perovskite structure. The fired powder is ball-milled again to refine the particle size (preferably down to ~0.7 µm). As obtained powder is dried and granulated with a corresponding amount of PVB binder, and is then pressed into pellets of 15.6 mm in diameter and 1.5 mm in thickness. The unsintered disks are debindered at 450° C. for 2 h and then sintered at high temperatures ranging from 1000 to 1200° C. for 1-2 h. The two main sides of the densified compacts are coated with silver paste to construct parallel-plates capacitors. Dielectric properties are measured with a high precision LCR bridge as a function of temperature and frequency. Elongation of the ceramics is measured as a function of electric field with a computer controlled high-voltage amplifier and linear variable differential transformer (LVDT) system. A triangle waveform and a low frequency of 0.1 Hz are used as the driving signal, of which the amplitude varies from 1 kV/mm to 7 kV/mm.

To explicitly elucidate the MPB between the tetragonal ferroelectric phase and the pseudo-cubic non-ferroelectric phase, in FIGS. 2(a) and (b) the XRD patterns and lattice constants as a function of y value (of above shown typical composition), where x is fixed as 0.2 (for example) are shown. With the increase of BMT content, the tetragonality of the ferroelectric phase decreases and finally disappears when y>0.10. The position of MPB is therefore determined as the composition or the composition region where the tetragonal phase and the pseudo-cubic phase coexist.

Compositions in the vicinity of the MPB exhibit vastly different dielectric and electro-mechanical properties, depending on which structure they have. On tetragonal side, y=0.09, for example, the ceramics behave like a typical ferroelectric material, demonstrated by the Square hysteresis P-E loop and butterfly-like Strain-E-field curve. A high piezoelectric coefficient can be directly measured with a Berlin-court-$d_{33}$-meter setup. In contrast, on the pseudo-cubic side y=0.11, for example, the ceramics show paraelectric features under small electric field, and change into ferroelectric phase under elevated electric field. When the external electric field is removed, the ceramic changes back into non-ferroelectric state, as is indicated by the pinched P-E loop and zero remanent strain in the S-E curve. For the MPB composition, the field dependence of polarization and strain shows an intermediate feature between the two aforementioned cases. FIGS. 3(a) and (b) show a representative P-E and S-E response of compositions in the vicinity of the MPB.

In the vicinity of the MPB large strain can be obtained in pseudo-cubic compositions owing to the electric field induced phase transition. However, this transition is a first order transition and cannot take place in a continuous and anhysteretic way. A first threshold field $E_{th1}$ [see FIG. 4(a)] has to be exceeded in order to induce the ferroelectric phase transition. At the same time, a second threshold field, $E_{th2}$ has to be larger than zero to recover the non-ferroelectric state when the electric field is removed. Such a necessity can be apparently seen in FIGS. 4(a) and (b), where the maximum strain and the effective piezoelectric constant $d_{33}^*=S_{max}/E_{max}$ abruptly increase when $E_{max}$ is larger than $E_{th1}$. With the further increase of $E_{max}$, the strain and polarization tend to saturate and $d_{33}^*$ gradually decreases.

The magnitude of $E_{th1}$ and $E_{th2}$ strongly depends on the composition: the farther the composition is away from the MPB, the higher the $E_{th}$ magnitudes are, as is illustrated in FIG. 5(a). As a consequence, the value of maximum $d_{33}^*$ decreases with the content of BMT in the pseudo-cubic side as shown in FIG. 5(b).

In summary, given an x value, the high electrostrain can be obtained by 1) adjusting the proportion of BMT so that $E_{th1}>E_{ths}\geq 0$, by 2) using a driving field of which $E_{max}>E_{th1}$. More preferably, the effective piezoelectric coefficient $d_{33}^*$ has a maximum value when $E_{th2}=0$ and $E_{max}=E_{th1}$, or 3) by a combination of 1) and 2).

In Table I the compositions that show high electrostrain behavior with various x values are summarized. The highest effective $d_{33}^*$ is obtained when the ferroelectric (1-x)BNT-xBT itself is near the MPB between tetragonal and rhombohedral phases. namely when x=0.07.

TABLE I

Compositions and their electromechanical performance in (1 − y)[(1 − x)BNT − xBT] − yBMT system:

| Sample No. | x | y | Ferroelectric symmetry | $S_{max}$ ($10^{-3}$) | $E_{max}$ (kV/mm) | $d_{33}^*$ (pm/V) |
|---|---|---|---|---|---|---|
| 1 | 0.05 | 0.12 | R | 3.67 | 6.6 | 550 |
| 2 | 0.06 | 0.06 | MPB | 4.09 | 5.0 | 820 |
| 3 | 0.07 | 0.04 | MPB | 4.00 | 5.0 | 800 |
| 4 | 0.15 | 0.09 | T | 2.39 | 3.9 | 610 |
| 5 | 0.20 | 0.11 | T | 2.17 | 3.5 | 620 |
| 6 | 0.30 | 0.11 | T | 2.26 | 3.9 | 580 |
| 7 | 0.40 | 0.08 | T | 1.92 | 3.5 | 550 |
| 8 | 0.60 | 0.065 | T | 1.73 | 3.8 | 360 |
| 9 | 0.80 | 0.065 | T | 1.03 | 2.1 | 490 |

Example 2

In this example a set of MPBs are formed between a rhombohedral ferroelectric phase and a pseudo-cubic non-ferroelectric phase within the ternary system constituted by $(Bi_{0.5}Na_{0.5})TiO_3$, $BaTiO_3$ and $Bi(Mg_{0.5}Ti_{0.5})O_3$ namely (BNT-BT-BMT).

The rhombohedral ferroelectric phase is formed by the solid solution between BNT and BT and its ferroelectric distortion is gradually diminished with increasing BMT content and finally eliminated at the MPB.

The typical composition can be formulated as (1-y)[(1-x) BNT-xBT]-yBMT where 0<x<0.05 and 0.06<y<0.14. The A/B ratios (with regard to the perovskite $ABO_3$ formula) in this example are all controlled as unit and no additive is introduced.

The processing and characterization of these compositions are similar to those depicted in example 1.

The structural change from rhombohedral to pseudo-cubic phase is realized by increasing BMT content as shown in FIG. 6(*a*). The electromechanical behavior of a typical composition is shown in FIG. 6(*b*).

Example 3

In this example an MPB is formed between a ferroelectric MPB composition and a pseudo-cubic non-ferroelectric phase within the ternary system constituted by $(Bi_{0.5}Na_{0.5})TiO_3$, $BaTiO_3$ and $Bi(Mg_{0.5}Ti_{0.5})O_3$, namely (BNT-BT-BMT).

The MPB ferroelectric composition is between two ferroelectric phases of different symmetry, e.g. tetragonal and rhombohedral phases in BNT-BT system. The ferroelectric distortion is gradually diminished with increasing BMT content and finally eliminated.

The typical composition can be formulated as (1-y)[(1-x) ENT-xBT]-yBMT where x=0.07 and 0.06<y<0.14. The A/B ratios (with regard to the perovskite $ABO_3$ formula) in this example are all controlled as unit and no additive is introduced.

The processing and characterization of these compositions are similar to those depicted in example 1.

Figure 7:
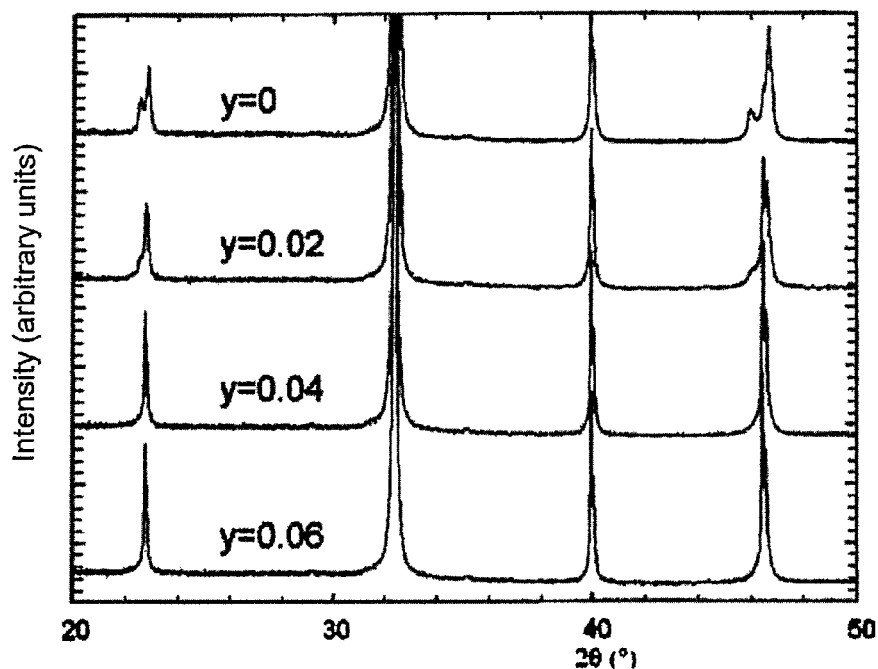
Figure 7:
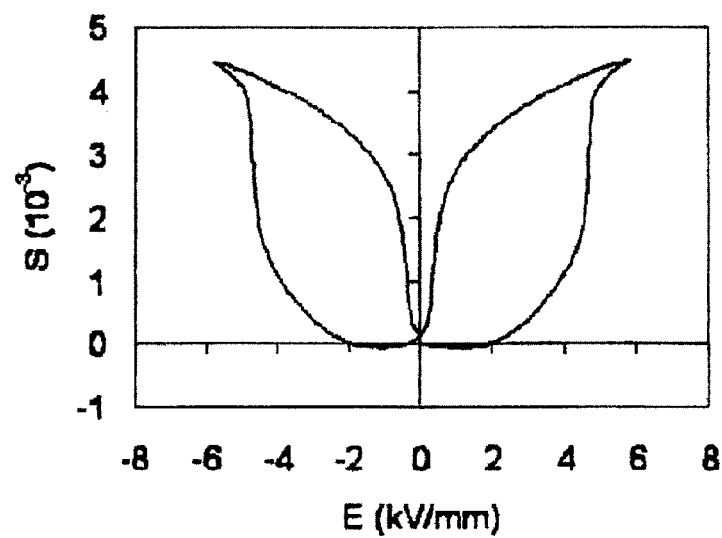

The structural change from ferroelectric MPB to pseudo-cubic phase is realized by increasing BMT content, as shown in FIG. 7(*a*). The electromechanical behavior of a typical composition is shown in FIG. 7(*b*).

Example 4

In this example an MPB is formed between a tetragonal ferroelectric and a pseudo-cubic non-ferroelectric phase within the ternary system constituted by $(Bi_{0.5}K_{0.5})TiO_3$, $BaTiO_3$ and $Bi(Mg_{0.5}Ti_{0.5})O_3$, namely (BKT-BT-BMT).

The tetragonal ferroelectric phase is formed by the solid solution between BKT and BT, and its ferroelectric distortion is gradually diminished with increasing BMT content and finally eliminated at the MPB.

The typical composition can be formulated as (1-y)[(1-x) BKT-xBT]-yBMT where x=0.20 and 0.09<y<0.14. The A/B ratios (with regard to the perovskite $ABO_3$ formula) in this example are all controlled as unit and no additive is introduced.

The processing and characterization of these compositions are similar to those depicted in example 1.

Figure 8:
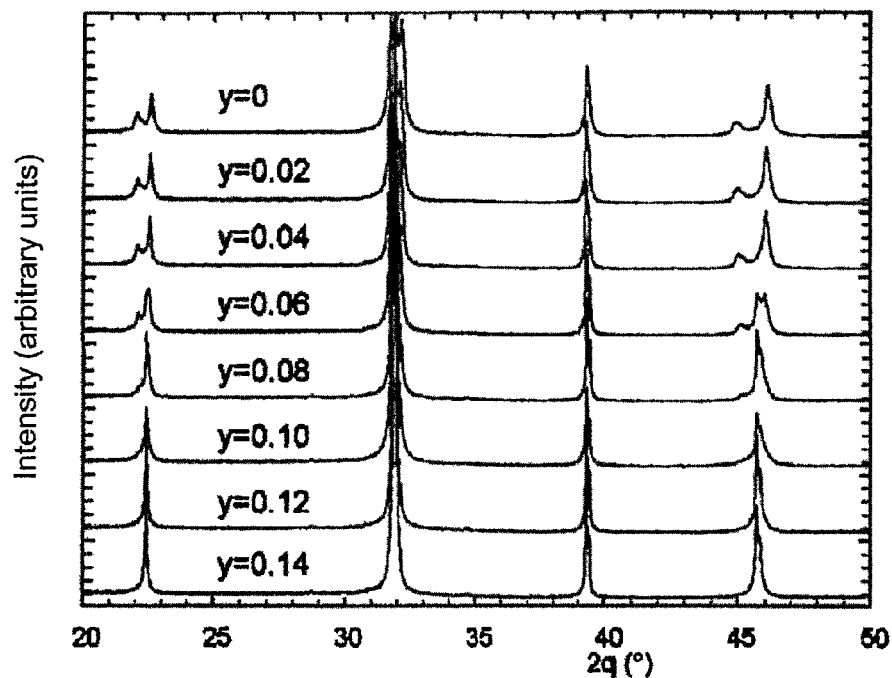
Figure 8:
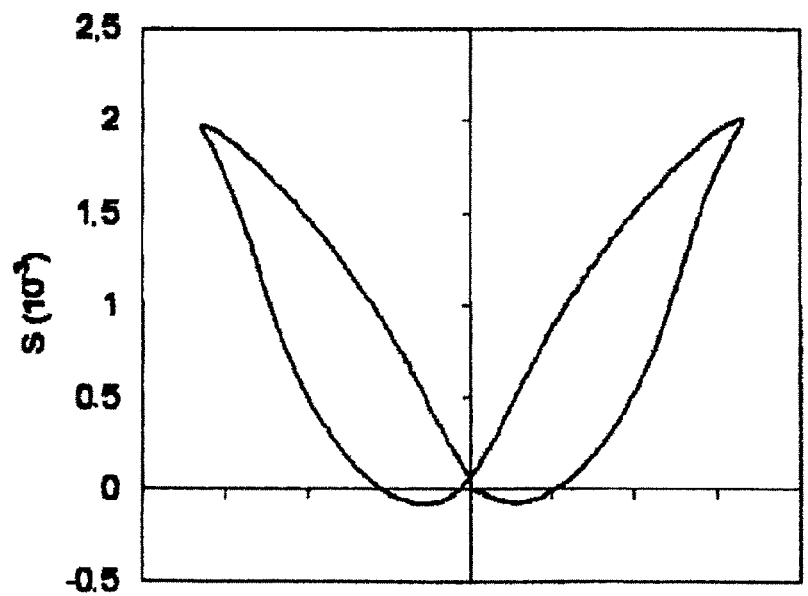

The structural change from tetragonal to pseudo-cubic phase is realized by increasing BMT content, as shown in FIG. 8(*a*). The electromechanical behavior of a typical composition is shown in FIG. 8(*b*).

Example 5

In this example an MPB is formed between a tetragonal ferroelectric and a pseudo-cubic non-ferroelectric phase within the ternary system constituted by $(Bi_{0.5}Na_{0.5})TiO_3$, $BaTiO_3$ and $Bi(Zn_{0.5}Ti_{0.5})O_3$, namely (BNT-BT-BZT).

The tetragonal ferroelectric phase is formed by the solid solution between BNT and BT, and its ferroelectric distortion is gradually diminished with increasing BZT content and finally eliminated at the MPB.

The typical composition can be formulated as (1-y)[(1-x) BNT-xBT]-yBZT where x=0.20 and 0.10<y<0.14. The A/B ratios (with regard to the perovskite $ABO_3$ formula) in this example are all controlled as unit and no additive is introduced.

The processing and characterization of these compositions are similar to those depicted in example 1.

The structural change from tetragonal to pseudo-cubic phase is realized by increasing BZT content, as shown in FIG. 9(*a*). The electromechanical behavior of a typical composition is shown in FIG. 9(*b*).

Example 6

In this example a matrix material of an MPB composition is made from $(Bi_{0.5}Na_{0.5})TiO_3$, $BaTiO_3$ and $Bi(Mg_{0.5}Ti_{0.5})O_3$, namely (BNT-BT-BMT). A small amount of (0.5 wt %) non-perovskite additive is introduced before sintering.

Figure 11:
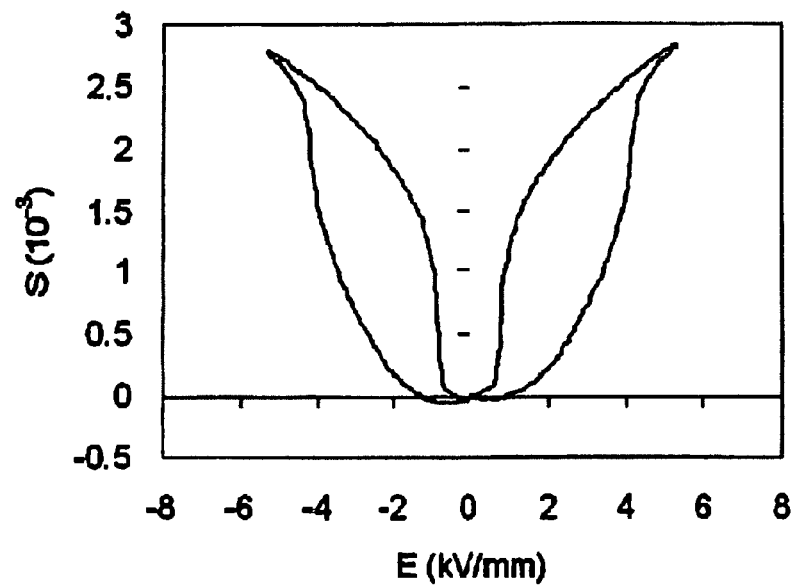
Figure 11:
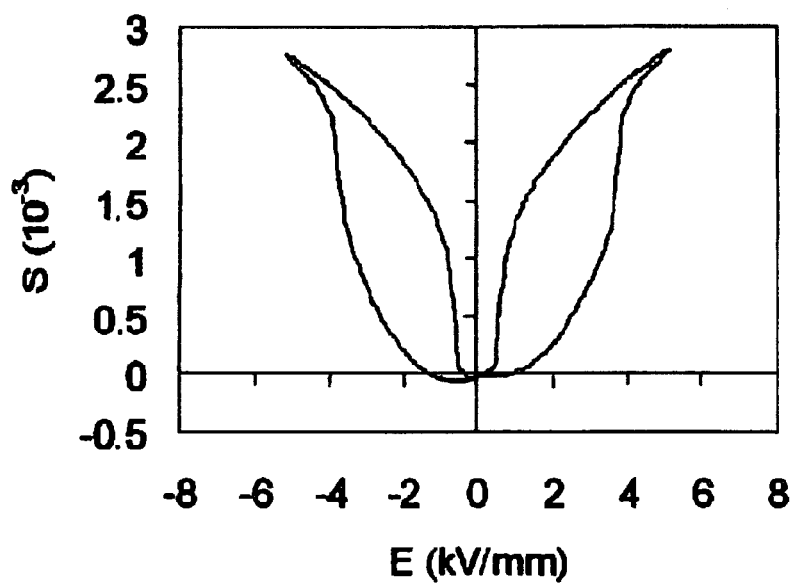
Figure 11:
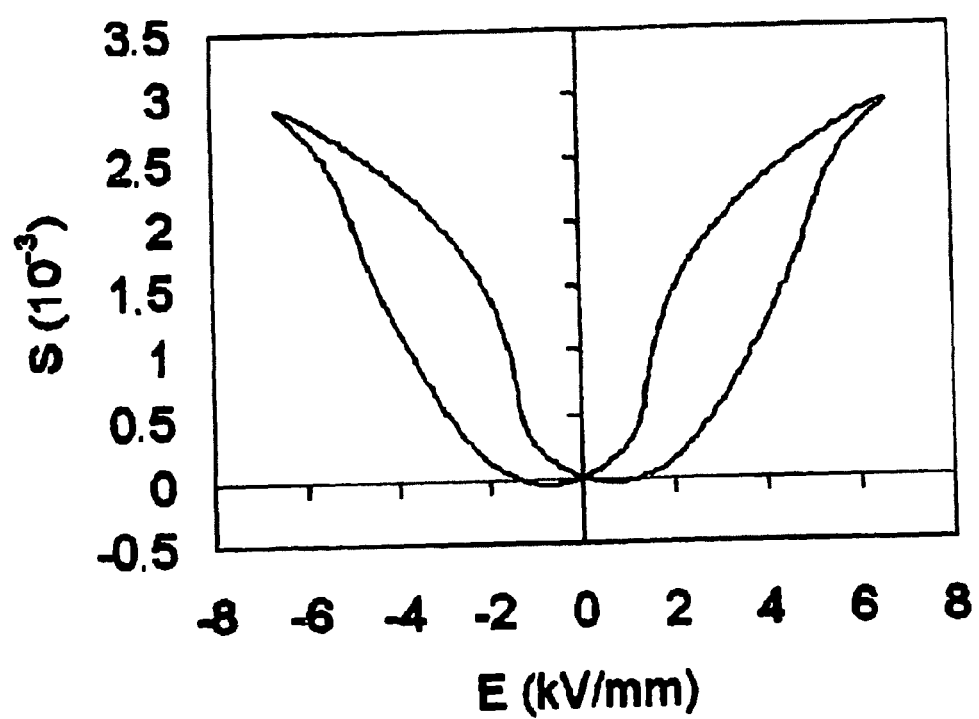

The content of the oxide additives is selected so as to enhance the processing properties and do not appreciably degrade the electromechanical properties. FIG. 10 shows the densification curves of lead-free compositions doped with various oxide additives. The densification temperature can be drastically decreased by MnO and ZnO. The electromechanical properties of the low-fired compositions (1100° C.) are shown in FIGS. 11(*a*), (*b*), and (*c*), respectively.

Miscellaneous Examples

When a piezoelectric ceramic composition according to an embodiment of the invention comprises a first matrix component selected from $(Bi_{0.5}A_{0.5})EO_3$ and $BaEO_3$, and a further matrix component being $Bi(Me_{0.5}E_{0.5})O_3$, is selected from an alkali metal, particularly sodium or potassium, or a mixture of alkali metals, E is independently selected from titanium, zirconium and mixtures of titanium and zirconium.

In a piezoelectric ceramic composition according to an embodiment of the invention, the additive is selected from transition metal oxides, particularly MnO, CuO and ZnO.

In a piezoelectric ceramic composition according to an embodiment of the invention, the contents of the matrix components are chosen so as to form a composition within the ferroelectric phase, within the morphotropic phase between a ferroelectric and a non-ferroelectric phase or within a non-ferroelectric phase in the vicinity of the morphotropic phase boundary.

In a piezoelectric ceramic composition according to an embodiment of the invention, the contents of the matrix components are chosen so as to form the non-ferroelectric phase in the vicinity of the morphotropic phase boundary and wherein the content of the matrix component $Bi(Me_{0.5}E_{0.5})O_3$ is selected to be between 0 and 3 mol% higher, preferably between 1 and 2 mol% higher, than the content of this matrix component in the corresponding composition at the phase boundary of the morphotropic phase and the non-ferroelectric phase.

In a piezoelectric ceramic composition according to an embodiment of the invention, the composition exhibits an effective piezoelectric constant $d_{33}^*$ greater than 350 pm/V, preferably greater than 549 pm/V, more preferably greater than 750 pm/V.

One aspect of the present invention is directed to a method for preparing a piezoelectric ceramic composition as described above, comprising the steps of (A) providing powders of metal salts of the metals contained in the first matrix component and any further matrix component or additive comprised in the ceramic composition, wherein the anions are selected from oxides, anions being at least partially convertible or converted into oxides upon calcination and mixtures thereof, wherein further the content of the raw particles is chosen according to the stoichiometry of the formula for the corresponding component or additive; and (B) shape forming and sintering of the obtained mixture.

In the above-described method for preparing a piezoelectric ceramic composition according to an aspect of the invention, between step A) and step B) the following step is carried out: C) calcining the mixture of powders provided in step A).

In the above-described method for preparing a piezoelectric ceramic composition according to an aspect of the invention, the metal salts are selected from oxides, hydroxides, carbonates, nitrates, hydrates and similar compounds.

In the above-described method for preparing a piezoelectric ceramic composition according to an aspect of the invention, the sintering is carried out at temperatures between 950° C. and 1200° C., for example between 1000° C. and 1150° C.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A piezoelectric ceramic composition comprising:
   a matrix material comprising at least two matrix components having a perovskite structure;
   a first matrix component being $(Bi_{0.5}A_{0.5})EO_3$;
   a second matrix component being $BaEO_3$; and
   a third matrix component being $Bi(Me_{0.5}E_{0.5})O_3$,
   wherein A is selected from an alkali metal, or a mixture of alkali metals;
   wherein E is independently selected from titanium, zirconium and mixtures of titanium and zirconium;
   wherein Me is selected from bivalent metals.

2. The piezoelectric ceramic composition according to claim 1, wherein the composition comprises the matrix material and an additive, the additive being a metal oxide, and is selected so as to enhance processing properties and to not appreciably degrade electromechanical properties.

3. The piezoelectric ceramic composition according to claim 1, wherein Me is selected from zinc, magnesium and a mixture of zinc and magnesium.

4. The piezoelectric ceramic composition according to claim 1, comprising a matrix material represented by the formula:

$$k\ (Bi_{0.5}A_{0.5})EO_3\text{-}l\ BaEO_3\text{-}m\ Bi(Me_{0.5}E_{0.5})O_3$$

wherein
$0<k\leq 0.96$,
$0<l\leq 0.96$,
$0.04\leq m\leq 0.15$ and
$k+l+m=1$.

5. The piezoelectric ceramic composition according to claim 4, comprising the matrix material and an additive, the composition represented by the following formula:

$$a[k\ (Bi_{0.5}A_{0.5})EO_3\text{-}l\ BaEO_3\text{-}m\ Bi(Me_{0.5}E_{0.5})O_3]\text{-}b\ M_fO_g$$

wherein M is selected from monovalent metals, bivalent metals and trivalent metals and mixtures thereof, wherein $M_fO_g$ represents the corresponding metal oxide $M_2O$, $MO$ or $M_2O_3$, $a+b=1$ and
wherein $0<b\leq 3$ weight % and $97\leq a\leq 100$ weight % of the ceramic composition.

6. The piezoelectric ceramic composition according to claim 1, wherein the composition comprises the matrix material and an additive, and the additive is selected from transition metal oxides, particularly MnO, CuO and ZnO.

7. The piezoelectric ceramic composition according to claim 1, wherein the contents of the matrix components are chosen so as to form a composition within the ferroelectric phase, within the morphotropic phase between a ferroelectric and a non-ferroelectric phase or within a non-ferroelectric phase in the vicinity of the morphotropic phase boundary.

8. The piezoelectric ceramic composition according to claim 7, wherein the contents of the matrix components are chosen so as to form the non-ferroelectric phase in the vicinity of the morphotropic phase boundary and wherein the content of the matrix component $Bi(Me_{0.5}E_{0.5})O_3$ is selected to be between 0 and 3 mol % higher than the content of this matrix component in the corresponding composition at the phase boundary of the morphotropic phase and the non-ferroelectric phase.

9. The piezoelectric ceramic composition according to claim 1, wherein the composition exhibits an effective piezoelectric constant $d_{33}{}^*$ greater than 350 pm/V.

10. The piezoelectric ceramic composition according to claim 1, wherein the composition exhibits an effective piezoelectric constant $d_{33}{}^*$ greater than 549 pm/V.

11. The piezoelectric ceramic composition according to claim 1, wherein the matrix material consists of the three matrix components having the perovskite structure.

12. A piezoelectric ceramic composition comprising:
    a matrix material comprising at least two matrix components having a perovskite structure;
    a first matrix component being selected from $(Bi_{0.5}A_{0.5})EO_3$ and $BaEO_3$; and
    a further matrix component being $Bi(Me_{0.5}E_{0.5})O_3$,
    wherein A is selected from an alkali metal, particularly sodium or potassium, or a mixture of alkali metals;
    wherein E is independently selected from titanium, zirconium and mixtures of titanium and zirconium;
    wherein Me is selected from bivalent metals; and
    wherein the composition comprises the matrix material and an additive, the additive being a metal oxide, and is selected so as to enhance processing properties and to not appreciably degrade electromechanical properties.

13. The piezoelectric ceramic composition according to claim 12, wherein the matrix material consists of said at least two matrix components having the perovskite structure.

14. A piezoelectric ceramic composition comprising:
    a matrix material comprising at least two matrix components having a perovskite structure;
    a first matrix component being selected from $(Bi_{0.5}A_{0.5})EO_3$ and $BaEO_3$; and
    a further matrix component being $Bi(Me_{0.5}E_{0.5})O_3$,
    wherein A is selected from an alkali metal, particularly sodium or potassium, or a mixture of alkali metals;
    wherein E is independently selected from titanium, zirconium and mixtures of titanium and zirconium;
    wherein Me is selected from bivalent metals; and
    wherein the additive is selected from transition metal oxides, particularly MnO, CuO and ZnO.

15. The piezoelectric ceramic composition according to claim 14, wherein the matrix material consists of said at least two matrix components having the perovskite structure.

16. A method for preparing the piezoelectric ceramic composition according to claim 1, comprising the steps of:
- A) providing powders of metal salts of the metals contained in the first matrix component and any further matrix component or additive comprised in the ceramic composition, wherein the anions of the metal salts are selected from oxygen, anions that allow the metal salt to be at least partially convertible or converted into oxides upon calcination and mixtures thereof, wherein further the content of the raw particles is chosen according to the stoichiometry of the formula for the corresponding component or additive; and
- B) shape forming and sintering of the obtained mixture.

17. The method according to claim 16, wherein between step A) and step B) the following step is carried out:
- C) calcining the mixture of powders provided in step A).

18. The method according to claim 16, wherein the metal salts are selected from oxides, hydroxides, carbonates, nitrates, and hydrates.

19. The method according to claim 16, wherein the sintering is carried out at temperatures between 950° C. and 1200° C.

20. The method according to claim 16, wherein the sintering is carried out at temperatures between 1000° C. and 1150° C.

21. An electrical component comprising a piezoelectric ceramic composition according to claim 1.

\* \* \* \* \*